(12) United States Patent
Kim et al.

(10) Patent No.: US 10,734,401 B1
(45) Date of Patent: Aug. 4, 2020

(54) SEMICONDUCTOR MEMORY DEVICE

(71) Applicant: SK hynix Inc., Icheon-si, Gyeonggi-do (KR)

(72) Inventors: Jae Taek Kim, Seoul (KR); Hye Yeong Jung, Seoul (KR)

(73) Assignee: Sk hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/681,624

(22) Filed: Nov. 12, 2019

(30) Foreign Application Priority Data

Jul. 16, 2019 (KR) ........................ 10-2019-0085769

(51) Int. Cl.
| | |
|---|---|
| *H01L 27/11575* | (2017.01) |
| *H01L 27/11524* | (2017.01) |
| *H01L 27/11556* | (2017.01) |
| *H01L 27/11548* | (2017.01) |
| *G11C 16/08* | (2006.01) |
| *H01L 27/1157* | (2017.01) |
| *H01L 27/11582* | (2017.01) |
| *H01L 27/11573* | (2017.01) |
| *G11C 16/04* | (2006.01) |
| *H01L 27/11529* | (2017.01) |

(52) U.S. Cl.
CPC .... *H01L 27/11575* (2013.01); *G11C 16/0483* (2013.01); *G11C 16/08* (2013.01); *H01L 27/1157* (2013.01); *H01L 27/11524* (2013.01); *H01L 27/11529* (2013.01); *H01L 27/11548* (2013.01); *H01L 27/11556* (2013.01); *H01L 27/11573* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 9,941,209 B2 | 4/2018 | Tessariol et al. | |
| 2003/0015743 A1* | 1/2003 | Ogawa | H01L 27/10852 257/296 |
| 2015/0263024 A1* | 9/2015 | Hishida | H01L 21/82343 257/329 |
| 2017/0117290 A1* | 4/2017 | Lee | H01L 27/11582 |
| 2018/0138195 A1* | 5/2018 | Lee | H01L 29/518 |

FOREIGN PATENT DOCUMENTS

| | | |
|---|---|---|
| KR | 1020180051901 A | 5/2018 |
| KR | 1020180131933 A | 12/2018 |

* cited by examiner

*Primary Examiner* — Thien F Tran
(74) *Attorney, Agent, or Firm* — William Park & Associates Ltd.

(57) ABSTRACT

The present technology relates to a semiconductor memory device. The semiconductor memory device includes a plurality of channel plugs disposed in a cell region of a semiconductor substrate, a first dummy region disposed at one end portion of the cell region and a second dummy region disposed at an other end portion of the cell region, and first dummy plugs disposed in the first dummy region and second dummy plugs disposed in the second dummy region. The number of the first dummy plugs is different than the number of the second dummy plugs.

20 Claims, 6 Drawing Sheets

SEMICONDUCTOR MEMORY DEVICE

CROSS-REFERENCE TO RELATED APPLICATION

The present application claims priority under 35 U.S.C. § 119(a) to Korean patent application number 10-2019-0085769, filed on Jul. 16, 2019, in the Korean Intellectual Property Office, the entire disclosure of which is incorporated herein by reference.

BACKGROUND

1. Technical Field

The present disclosure relates to an electronic device, and more particularly, to a semiconductor memory device.

2. Related Art

Among semiconductor devices, a semiconductor memory device is largely classified into a volatile memory device and a non-volatile memory device.

A write speed and a read speed of a non-volatile memory device are relatively slow. However, due to the non-volatile memory device's ability to maintain data when the power supply is cut off, the non-volatile memory device is utilized to store data. A non-volatile memory device includes a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. The flash memory is classified into a NOR type and a NAND type.

The flash memory has an advantage of a RAM which is free to program and erase data and an advantage of a ROM which may preserve stored data when the power supply is cut off. The flash memory is widely used as a storage medium of a portable electronic device such as a digital camera, a personal digital assistant (PDA), and an MP3 player.

The flash memory device may be classified into a two-dimensional semiconductor memory device in which a string is horizontally formed on a semiconductor substrate, and a three-dimensional semiconductor memory device in which a string is vertically formed on a semiconductor substrate.

The three-dimensional semiconductor memory device is a memory device designed to solve an integration limit of the two-dimensional semiconductor memory device, and includes a plurality of channel plugs, vertically formed on the semiconductor substrate. The channel plugs include a drain select transistor, memory cells, and a source select transistor, connected, in series, between a bit line and a source line.

SUMMARY

A semiconductor memory device according to an embodiment of the present disclosure includes a plurality of channel plugs disposed in a cell region of a semiconductor substrate, a first dummy region disposed at one end portion of the cell region and a second dummy region disposed at an other end portion of the cell region, and first dummy plugs disposed in the first dummy region and second dummy plugs disposed in the second dummy region. The number of the first dummy plugs is different than the number of the second dummy plugs.

A semiconductor memory device according to an embodiment of the present disclosure includes a decoder region, a first dummy region, a cell region, and a second dummy region sequentially arranged, respectively, in a first direction of a semiconductor substrate, a plurality of channel plugs vertically arranged in the cell region, and a plurality of dummy plugs arranged in the first dummy region and the second dummy region. The number of first dummy plugs is greater than the number of second dummy plugs.

A semiconductor memory device according to an embodiment of the present disclosure includes a decoder region, a first dummy region, a cell region, and a second dummy region sequentially arranged, respectively, in a first direction of a semiconductor substrate, a plurality of channel plugs vertically arranged in the cell region, and a plurality of dummy plugs arranged in the first dummy region and the second dummy region. The first dummy region is wider than the second dummy region.

DETAILED DESCRIPTION

Figure 1:
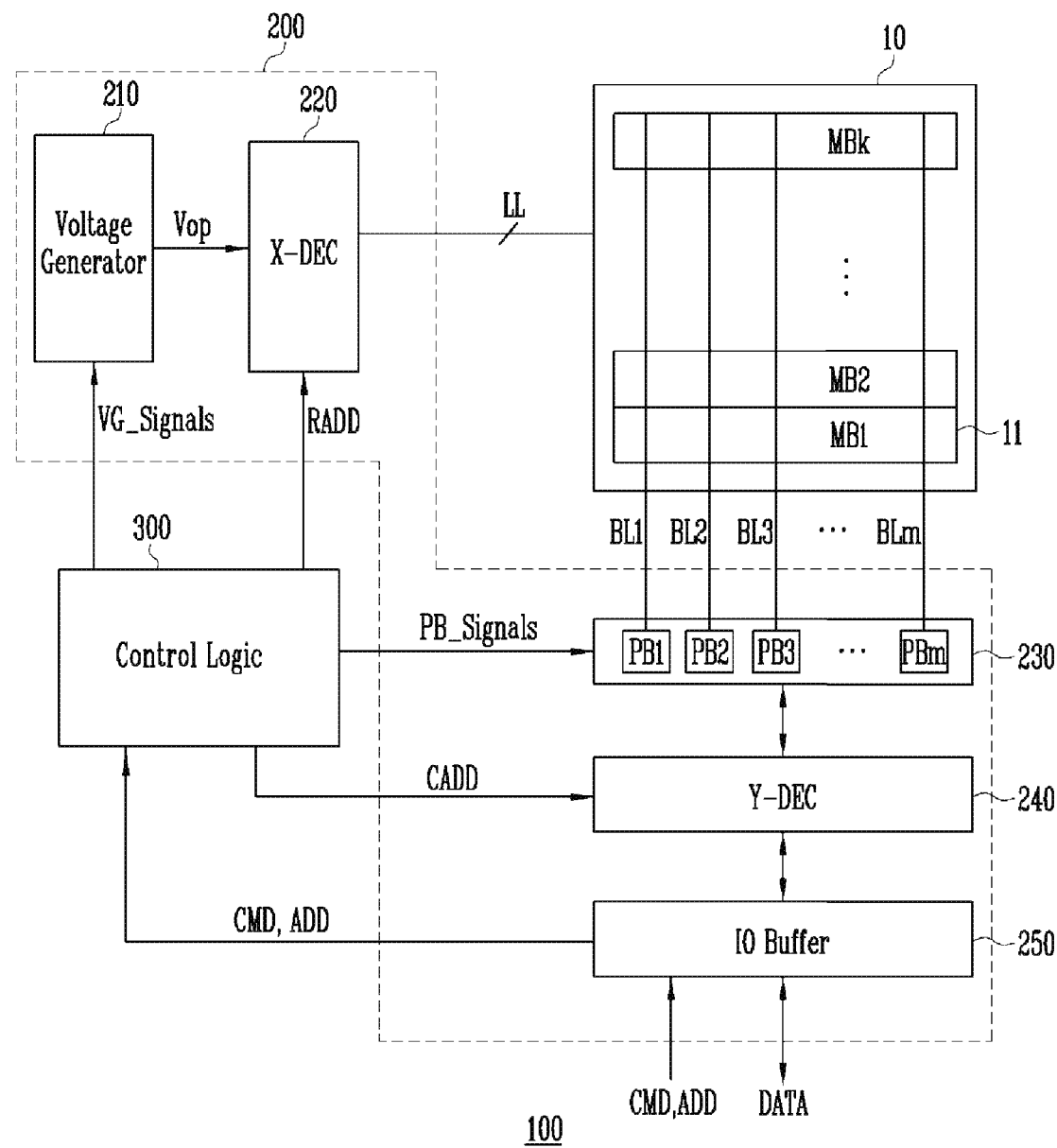
FIG. 1 is a block diagram for describing a semiconductor memory device, according to an embodiment of the present disclosure.

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Since various modifications and changes may be applied to the embodiment according to the concept of the present disclosure and the embodiment according to the concept of the present disclosure may have various forms, the specific embodiments will be illustrated in the drawings and described in the present specification or application. However, it should be understood that the embodiment according to the concept of the present disclosure is not construed as limited to a specific disclosure form and includes all changes, equivalents, or substitutes that do not depart from the spirit and technical scope of the present disclosure.

While terms such as "first", "second", and/or the like may be used to describe various components, such components should not be limited to the above-described terms. The above-described terms may be used only to distinguish one component from another component. For example, a first component may be referred to as a second component and similarly, a second component may be referred to as a first component without departing from the scope according to the concept of the present disclosure.

It should be understood that when a component is referred to as being "connected" or "coupled" to another component, the component may be directly connected or coupled to the other element or an intervening component may also be present. In contrast, it should be understood that when a component is referred to as being "directly connected" or "directly coupled" to another component, no intervening component is present. Other expressions describing relationships between components such as "~between," "immediately~between" or "adjacent to ~", "directly adjacent to ~", and the like should be construed similarly.

The terms used in the present specification are merely used to describe a specific embodiment, and are not intended to limit the present disclosure. Singular expression includes a plural expression, unless the context clearly indicates otherwise. In the present specification, it should be understood that a term "include", "have", or the like indicates that a feature, a number, a step, an operation, a component, a part, or a combination thereof described in the present specification is present, but do not exclude a possibility of presence or addition of one or more other features, numbers, steps, operations, components, parts, or combinations thereof.

So far as not being differently defined, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in the present specification, should not be construed as having idealistic or excessively formal meanings.

In describing the embodiment, description of technical contents which are well known in the technical field of the present disclosure and are not directly related to the present disclosure will be omitted. This intends to disclose the gist of the present disclosure more clearly by omitting unnecessary description.

Hereinafter, embodiments of the present disclosure will be described in detail with reference to the accompanying drawings, so that those skilled in the art to which the present disclosure pertains may easily carry out the technical spirit of the present disclosure.

The present technology provides a semiconductor memory device capable of improving an inclination phenomenon of channel plugs.

According to the present technology, the number of the dummy plugs disposed in the first dummy region of the first dummy region and the second dummy region disposed at both end portions of the cell region, which is adjacent to the X decoder is greater than the number of the dummy plugs disposed in the second dummy region. Therefore, a difference of degrees of inclination of the channel plugs disposed at both end portions of the cell region may be improved by the interlayer insulating layer stacked on the X decoder region.

FIG. 1 is a block diagram for describing a semiconductor memory device, according to an embodiment of the present disclosure.

Referring to FIG. 1, the semiconductor memory device 100 may include a memory cell array 10, a voltage generation circuit (voltage generator) 210, an X decoder (X-DEC) 220, a read and write circuit 230, a Y decoder (Y-DEC) 240, an input/output buffer (IO buffer) 250, and a control logic 300. The voltage generation circuit (voltage generator) 210, the X decoder (X-DEC) 220, the read and write circuit 230, the Y decoder (Y-DEC) 240, and the input/output buffer (IO buffer) 250 may be defined as a peripheral circuit that performs a program operation, a read operation, and an erase operation on the memory cell array 10.

The memory cell array 10 includes a plurality of memory blocks MB1 to MBk. The plurality of memory blocks MB1 to MBk are connected to the X decoder 220 through the local lines LL. The plurality of memory blocks MB1 to MBk are connected to the read and write circuit 230 through the bit lines BL1 to BLm. Each of the plurality of memory blocks MB1 to MBk includes a plurality of memory cells. In this particular embodiment, the plurality of memory cells are non-volatile memory cells.

Each of the plurality of memory blocks MB1 to MBk includes a plurality of memory strings. Each of the plurality of memory strings includes a drain select transistor, a plurality of memory cells, and a source select transistor, connected, in series, between the bit line and the source line. In addition, each of the plurality of memory strings may include a pass transistor between the source select transistor and the memory cells and between the drain select transistor and the memory cells. A detailed description of the memory cell array 10 will be described later.

The voltage generation circuit 210 generates a plurality of operation voltages Vop in response to voltage generation control signals VG_Signals, output from the control logic 300. For example, the voltage generation circuit 210 generates a program voltage and a pass voltage during a program operation, and generates a read voltage and a pass voltage during a read operation.

The X decoder 220 applies the plurality of operation voltages Vop to a selected memory block among the memory blocks MB1 to MBk through the local lines LL, in response to the row address RADD output from the control logic 300. For example, during the program operation, the X decoder 220 applies the program voltage to a selected word line, among the local lines LL, and applies the pass voltage to unselected word lines. In addition, during the read operation, the X decoder 220 applies the read voltage to the selected word line and applies the pass voltage to the unselected word lines.

The read and write circuit 230 includes a plurality of page buffers PB1 to PBm. The plurality of page buffers PB1 to PBm are connected to the memory cell array 10 through the bit lines BL1 to BLm. During the program operation, each of the plurality of page buffers PB1 to PBm temporarily stores data DATA, received through the input/output buffer 250 and the Y decoder 240, and adjusts the potential level of the bit lines BL1 to BLm based on the temporarily stored data DATA. For example, when the data DATA is "1", each of the plurality of page buffers PB1 to PBm may apply a program prohibition voltage (for example, Vcc) to a corresponding bit line. Conversely, when the data DATA is "0", each of the plurality of page buffers PB1 to PBm may apply a program allowance voltage (a voltage lower than Vcc, for example, 0 V) to the corresponding bit line. In addition, during the read operation, each of the plurality of page buffers PB1 to PBm pre-charges the bit lines BL1 to BLm to a set level. Then, when a read voltage is applied to the selected memory block, the plurality of page buffers PB1 to PBm performs the read operation by sensing the potential level or the current amount of the bit lines BL1 to BLm.

The read and write circuit 230 may be controlled by the control logic 300 through the page buffer control signals PB_Signals.

The input/output buffer 250 receives a command CMD and an address ADD from the outside, transmits the command CMD and the address ADD to the control logic 300, and transmits the data DATA to the Y decoder 240 during the program operation. In addition, the input/output buffer 250 receives the data DATA read from the Y decoder 240 and outputs the data DATA to the outside during the read operation.

During the program operation, the Y decoder 240 transmits the data DATA to the read and write circuit 230 in response to a column address CADD received from the control logic 300, and, during the read operation, transmits the data DATA, read from the read and write circuit 230, to the input/output buffer 250.

The control logic 300 is connected to the voltage generation circuit 210, the X decoder 220, the read and write circuit 230, the Y decoder 240, and the input/output buffer 250. The control logic 300 is configured to control the overall operation of the semiconductor memory device 100 in response to the command CMD received from the input/output buffer 250. For example, the control logic 300 receives the command CMD, corresponding to a program operation, a read operation, or an erase operation, and controls the peripheral circuit 200 to perform the program operation, the read operation, or the erase operation, in response to the received command CMD. Specifically, the control logic 300 receives the command CMD and the address ADD, generates and outputs the voltage generation control signals VG_Signals and the page buffer control signals PB_Signals in response to the received command CMD, generates the row address RADD and the column address CADD based on the address ADD, and outputs the generated row address RADD and the column address CADD to the X decoder 220 and the Y decoder 240, respectively.

Figure 2:
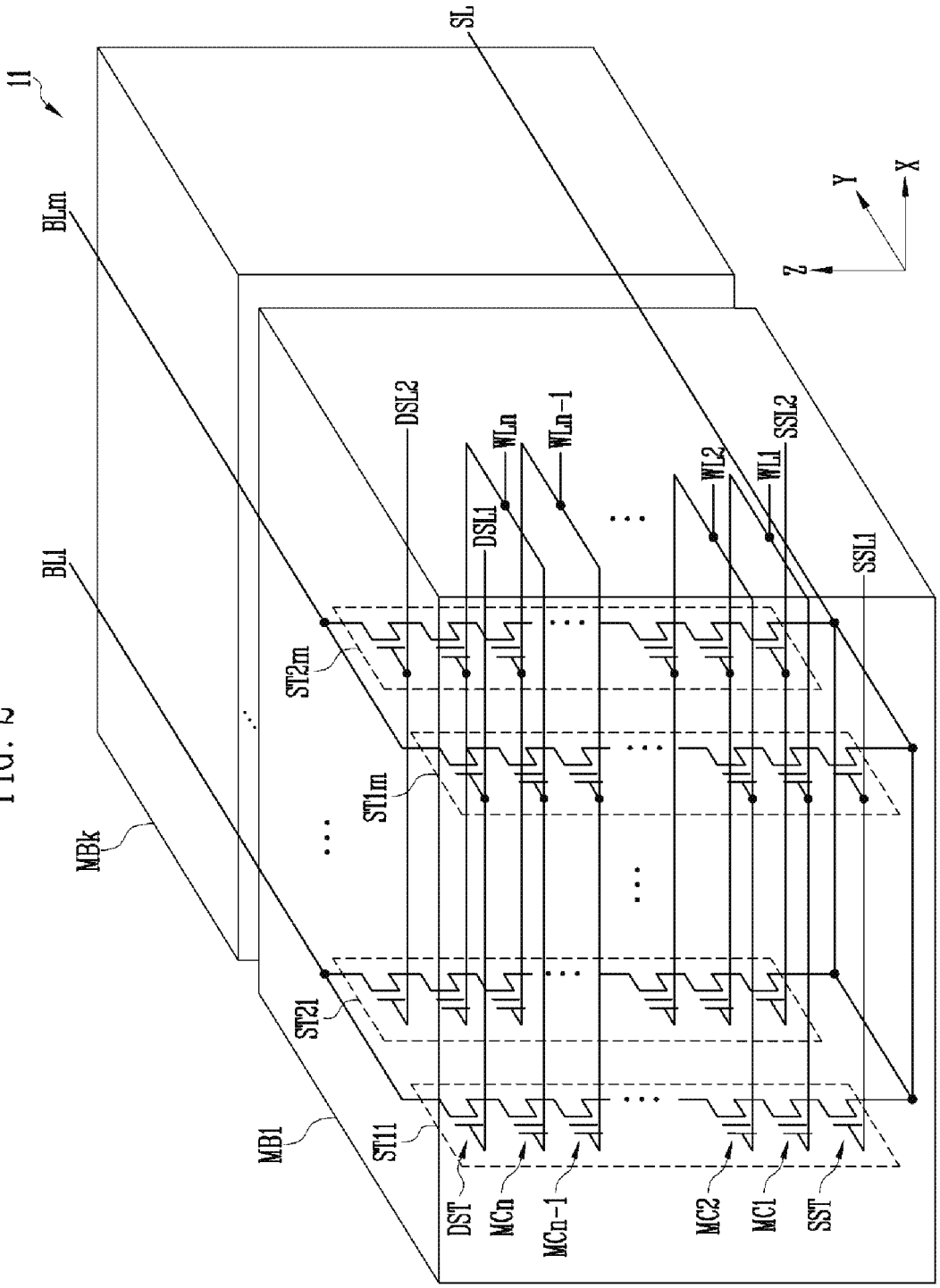
FIG. 2 is a diagram for describing memory blocks, configured in a three-dimension.

FIG. 2 is a diagram for describing memory blocks, configured in a three-dimension.

Referring to FIG. 2, the memory cell array 10 may include a plurality of memory blocks MB1 to MBk. For illustrative purpose, FIGS. 1-2 point out a particular memory block of the plurality of memory blocks MB1 to MBk, and the particular memory block has been labelled "memory block 11." The memory block 11 may include a plurality of strings ST11 to ST1m and ST21 to ST2m. Each of the plurality of strings ST11 to ST1m and ST21 to ST2m may extend along a vertical direction (Z direction). In the memory block 11, m strings may be arranged in a row direction (X direction). For example, the plurality of strings ST11 to ST1m may be arranged along the X direction. Furthermore, two sets of m strings may be arranged in a column direction (Y direction). For example, the plurality of strings ST11 to ST1m and ST21 and ST2m may be arranged in the Y direction. With regard to the two sets of m strings shown in FIG. 2, this is merely for illustrative purposes and three or more strings may be arranged in the column direction (Y direction).

Each of the plurality of strings ST11 to ST1m and ST21 to ST2m may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings, arranged in the same row, may be connected to the same source select line. For example, the source select transistors of the strings ST11 to ST1m, arranged in the first row, may be connected to a first source select line SSL1. On the other hand, the source select transistors of the strings ST21 to ST2m, arranged in the second row, may be connected to a second source select line SSL2. In another embodiment, the source select transistors of the strings ST11 to ST1m and ST21 to ST2m may be commonly connected to one source select line.

The first to n-th memory cells MC1 to MCn of each string may be connected to each other, in series, between the source select transistor SST and the drain select transistor DST. Gates of the first to n-th memory cells MC1 to MCn may be connected to the first to n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. Therefore, reliability of the data stored in the memory block 11 may be improved.

The drain select transistor DST of each string may be connected between the bit line and the memory cells MC1 to MCn. The drain select transistors DST of the strings, arranged in the row direction, may be connected to the drain select line, extending in the row direction. For example, the drain select transistors DST of the strings ST11 to ST1m of the first row may be connected to a first drain select line DSL1. On the other hand, the drain select transistors DST of the strings ST21 to ST2m of the second row may be connected to a second drain select line DSL2.

The plurality of strings ST11 to ST1m and ST21 to ST2m described above may correspond to a plurality of channel plugs which will be described later.

Figure 3:
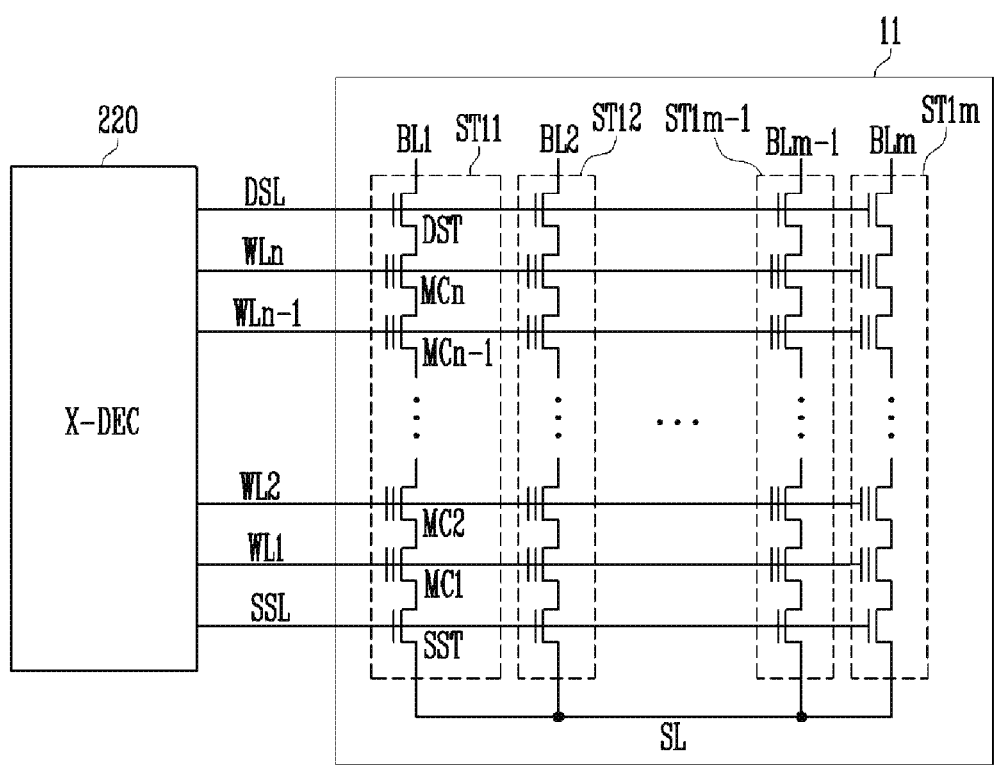
FIG. 3 is a diagram for describing a connection relationship between an X decoder and a memory block of FIG. 1.

FIG. 3 is a diagram for describing a connection relationship between the X decoder and the memory block of FIG. 1.

Referring to FIG. 3, the plurality of strings ST11 to ST1m included in the memory block 11 are connected to the X decoder 200 through a drain select line DSL, a plurality of word lines WL1 to WLn, and a source select line SSL.

The X decoder 220 and the plurality of strings ST11 to ST1m may be formed in different layers. For example, the X decoder 220 may be formed at a layer lower than channel plugs corresponding to the plurality of strings ST11 to ST1m. Therefore, the drain select line DSL, the plurality of word lines WL1 to WLn, and the source select line SSL are connected to the channel plugs and arranged to extend to an upper portion of the X decoder 220 in parallel with the semiconductor substrate. Furthermore, the drain select line DSL, the plurality of word lines WL1 to WLn, and the source select line SSL are connected to the X decoder 220 by a plurality of metal wires at the upper portion of the X decoder 220.

An interlayer insulating layer is stacked on the X decoder 220 to surround the plurality of metal wires and the plurality of word lines. A degree of inclination of the plurality of channel plugs included in the memory block 11 may vary according to a distance from a region where the X decoder 220 is formed by the interlayer insulating layer stacked on the X decoder 220.

A structure of the X decoder 220 and the memory block 11 will be described in detail later with reference to FIG. 4.

Figure 4:
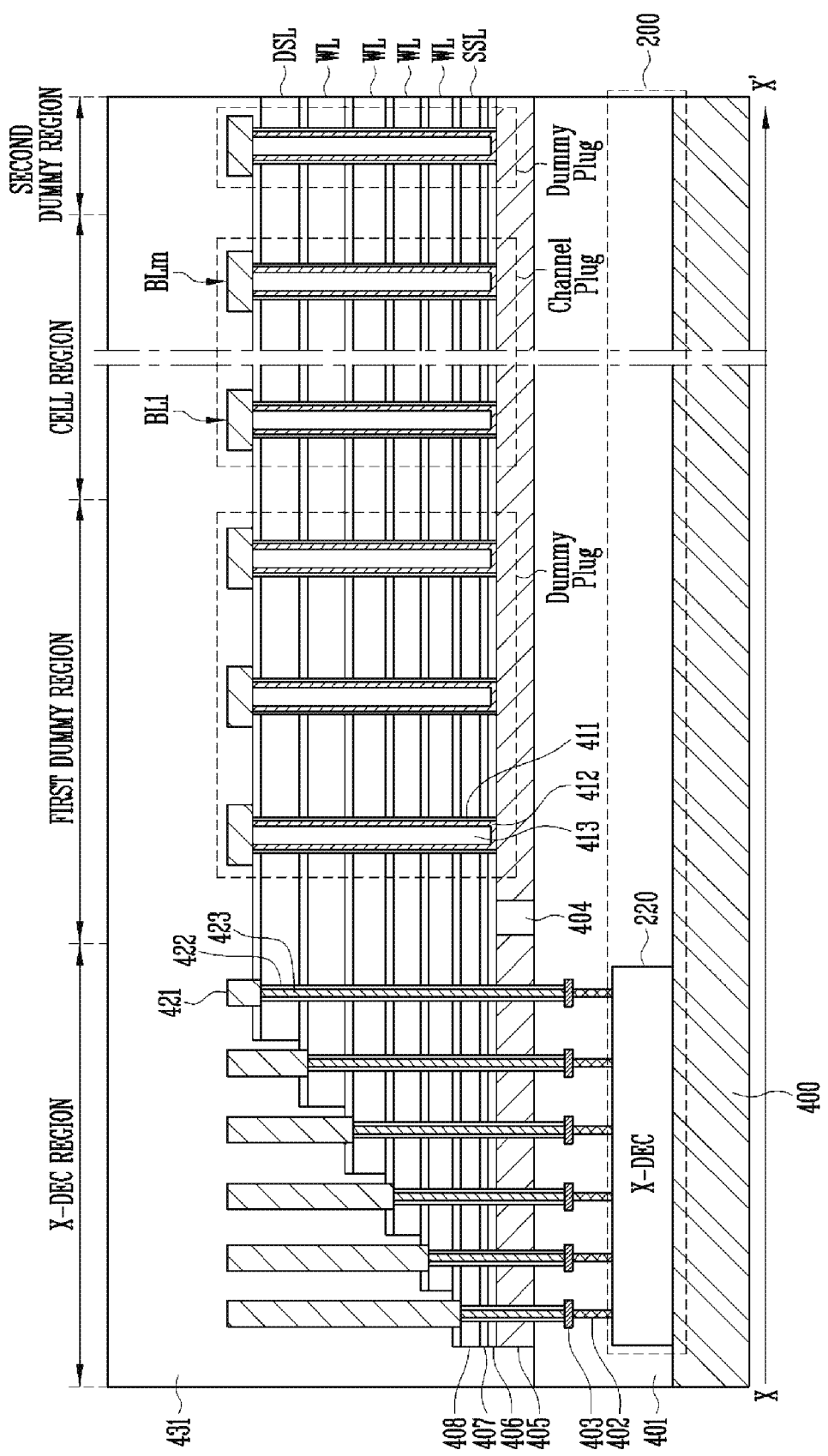
FIG. 4 is a cross-sectional view of a semiconductor memory device in which an X decoder and a memory block are formed, according to an embodiment of the present disclosure.

FIG. 4 is a cross-sectional view of a semiconductor memory device in which an X decoder and a memory block are formed, according to an embodiment of the present disclosure.

Referring to FIG. 4, in the semiconductor substrate 400, an X-DEC region, a first dummy region, a cell region, and a second dummy region are sequentially disposed in one direction (X-X'). The X-DEC region is a region where the X decoder 220 of FIG. 3 is disposed, and the first dummy region, the cell region, and the second dummy region are regions where the memory block 11 of FIG. 3 is disposed.

The semiconductor memory device according to an embodiment of the present disclosure may have a peri under cell (PUC) structure. The peripheral circuit 200 may be provided under the memory cell block 11 including a plurality of channel plugs, a plurality of dummy plugs, a plurality of word lines WL, and a plurality of bit lines BL.

In an embodiment, the peripheral circuit 200 may include the X decoder 220. Although not shown, the peripheral circuit 200 may further include at least one of the voltage generation circuit 210, the read and write circuit 230, the Y decoder 240, and the input/output buffer 250 of FIG. 1. The memory block may have a circuit configuration as shown in FIGS. 2 and 3.

The peripheral circuit 200 may be provided on the semiconductor substrate 400, and the memory block may be provided on an upper substrate 405.

The semiconductor substrate 400 may be a single crystal silicon substrate. The semiconductor substrate 400 may include a polysilicon substrate, a silicon on insulator (SOI) substrate, or a germanium on insulator (GeOI) substrate. A lower substrate 10 may include Si, Ge, and SiGe.

A first interlayer insulating layer 401, covering the peripheral circuit 200, along with the X decoder 220, may be provided on the semiconductor substrate 400. The first interlayer insulating film 401 may include, for example, an insulating film such as a silicon oxide film. Metal wires 402 and 403, connected to the X decoder 220, may be provided in the first interlayer insulating layer 401.

The upper substrate 405 may be stacked on the first interlayer insulating film 401. Furthermore, second interlayer insulating films 407 and word line conductive films 408 may be alternately stacked on the upper substrate 405.

The upper substrate 405 may include polycrystalline silicon. The upper substrate 405 may be formed by forming a predetermined polycrystalline silicon region on the first interlayer insulating layer 401 and growing the polycrystalline silicon using the predetermined polycrystalline silicon region as a seed layer. The upper substrates 405 may be separated from each other by a slit 404, marking a boundary portion between the X-DEC region and the first dummy region. The slit 404 may be filled with an insulating film pattern.

The word "predetermined" as used herein with respect to a parameter, such as a predetermined region, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The second interlayer insulating film 407 may include an insulating material such as an oxide, and the word line conductive film 408 may include a conductive material such as polysilicon or tungsten. A conductive film stacked on the lowermost portion of the word line conductive film 408 may be a source select line SSL, a conductive film stacked on the uppermost of the word line conductive film 408 may be a drain select line DSL, and the remaining word line conductive films may be the word lines WL.

An etch stop film 406 may be additionally formed between the second interlayer insulating film 407 and the upper substrate 405. The etch stop film 406 prevents the upper substrate 405 from being etched during the hole forming process for forming the plurality of channel plugs and the plurality of dummy plugs.

The memory block may include the plurality of channel plugs and the plurality of dummy plugs. The plurality of channel plugs correspond to the strings ST11 to ST1$m$ shown in FIG. 3, respectively, and are spaced apart from each other at regular intervals on the cell region of the semiconductor substrate 400. The plurality of dummy plugs are spaced apart from each other at regular intervals in the first dummy region and the second dummy region of the semiconductor substrate 400.

In an embodiment of the present disclosure, the number of dummy plugs, arranged in the first dummy region, adjacent to the X-DEC region, is greater than the number of dummy plugs, arranged in the second dummy region, which is not adjacent to the X-DEC region. In addition, the first dummy region is wider than the second dummy region.

Each of the plurality of channel plugs is formed perpendicularly to the upper substrate 405, penetrating the second interlayer insulating layers 407 and the word line conductive films 408, stacked on the cell region. Each of the channel plugs includes a gap fill film 413, a channel pattern 412 surrounding the gap fill film 413, and a memory pattern 413 surrounding the channel pattern 412. For example, the memory pattern 413 may include at least one of a charge blocking film, a data storage film, and a tunnel insulating film. Furthermore, the data storage film may include a floating gate such as silicon, a charge trapping material such as nitride, a phase change material, a nano dot, and the like. In addition, the channel pattern 412 may be formed to be completely filled up to a center region or may be formed in a structure in which the center region is opened. The gap fill film 413 may be formed in the opened center region. An upper portion of each of the channel plugs is connected to the bit line (any one of BL1 to BLm).

The plurality of dummy plugs formed in the first dummy region and the second dummy region are formed perpendicularly to the upper substrate 405, penetrating the second interlayer insulating layers 407 and the word line conductive films 408, stacked on the first dummy region and the second dummy region. The plurality of dummy plugs may be formed in the same structure as the plurality of channel plugs.

The second interlayer insulating films 407 and the word line conductive films 408, formed on the X-DEC region, are formed in a step-wise structure. That is, the second interlayer insulating layers 407 and the word line conductive films 408 may protrude farther in a horizontal direction than a second interlayer insulating film and a second word line conductive film of an upper layer and may have step-wise portions.

The second interlayer insulating films 407 and the word line conductive films 408, formed on the X-DEC region, may be provided with contacts 423, penetrating through the second interlayer insulating films 407 and the word line conductive films 408 in a vertical direction. Sidewall insulating films 422 may be provided between a sidewall of the contacts 423 and the word line conductive films 408. Each of the sidewall insulating films 422 may have a straw or cylinder shell shape surrounding an outer wall of the contacts 423.

Pads 421, electrically connected to each of the contacts 423, may be provided on the X-DEC region. The pads 421 may include polysilicon, doped with an impurity. In an embodiment, each of the pads 421 may be electrically connected to each of the step-wise protruding word line conductive films 408, respectively. The upper surface of the pads 421 may be disposed on the same plane as the bit lines BL1 to BLm. In this case, the pads 421 may be provided in different lengths.

A third interlayer insulating film 431 is stacked on the entire structure, including the step-wise portions of the word line conductive films 408.

A lower end portion of the pads 421 may be electrically connected to the contacts 423. Therefore, each of the word line conductive films 408 may be connected to the X decoder 220 through the pads 421, the contacts 423, and the metal wires 402 and 403.

As described above, according to the embodiment of the present disclosure, the dummy plugs are formed on the first and second dummy regions, disposed at both end portions of the cell region, and the number of the dummy plugs disposed in the first dummy region, adjacent to the X decoder, is greater than the number of the dummy plugs disposed in the second dummy region. Therefore, even though various stresses, generated during a manufacturing process of the semiconductor memory device, occur, the dummy plugs, disposed in the first dummy region, serve as a bumper. Therefore, the configuration helps to avoid the phenomenon of the channel plugs of the cell region being bent.

Figure 5:
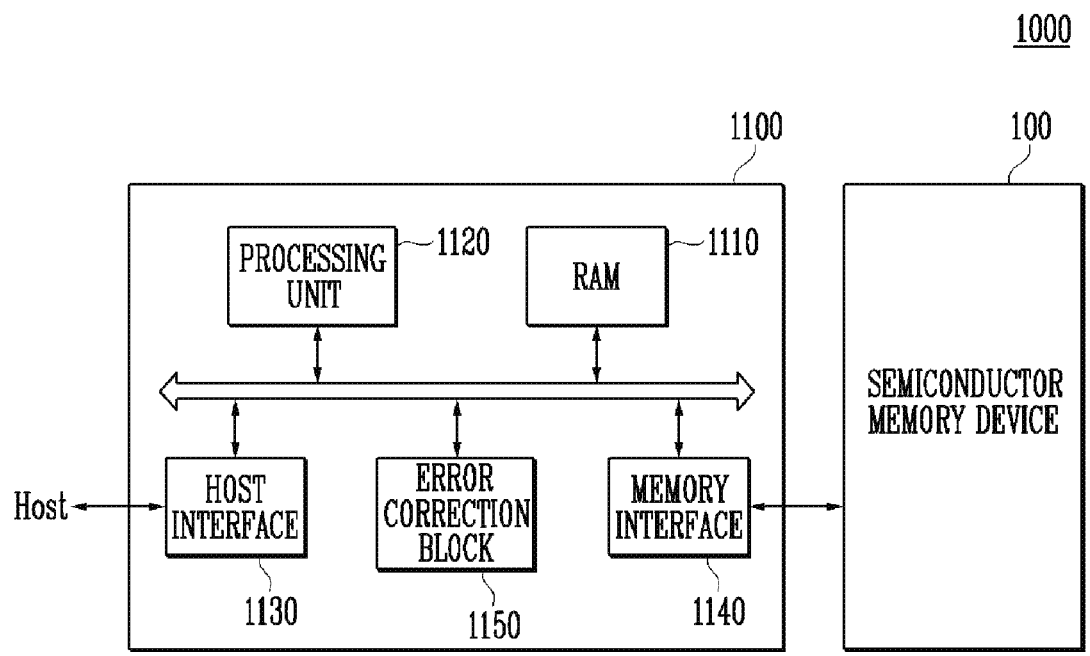
FIG. 5 is a block diagram, illustrating a memory system, including the semiconductor memory device of FIG. 1.

FIG. 5 is a block diagram, illustrating a memory system, including the semiconductor memory device of FIG. 1.

Referring to FIG. 5, the memory system 1000 includes the semiconductor memory device 100 and a controller 1100.

The semiconductor memory device 100 may be configured and operated in the same manner as described with reference to FIG. 1. Hereinafter, a repetitive description will be omitted.

The controller 1100 is connected to a host Host and the semiconductor memory device 100. The controller 1100 is configured to access the semiconductor memory device 100 in response to a request from the host Host. For example, the controller 1100 is configured to control the read operation, the write operation, and a background operation of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls all operations of the controller 1100. In addition, the controller 1100 may temporarily store program data provided from the host Host during a write operation.

The host interface 1130 includes a protocol for performing data exchange between the host Host and the controller 1100. As an exemplary embodiment, the controller 1100 is configured to communicate with the host Host through at least one of various interface protocols such as a universal serial bus (USB) protocol, a multimedia card (MMC) 10o protocol, a peripheral component interconnection (PCI) protocol, a peripheral component interconnect-express (PCI-express) protocol, an advanced technology attachment (ATA) protocol, a serial ATA (SATA) protocol, a parallel ATA (PATA) protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface includes a NAND interface or a NOR interface.

The error correction block 1150 is configured to detect and correct an error of data received from the semiconductor memory device 100 using an error correcting code (ECC). The processing unit 1120 will control the semiconductor memory device 100 to adjust a read voltage and perform the read operation again in accordance with an error detection result of the error correction block 1150. As an exemplary embodiment, the error correction block 1150 may be provided as a component of the controller 1100.

The controller 1100 and the semiconductor memory device 100 may be integrated into one semiconductor device. As an exemplary embodiment, the controller 1100 and the semiconductor memory device 100 may be integrated into one semiconductor device to form a memory card. For example, the controller 1100 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash memory (UFS).

The controller 1100 and the semiconductor memory device 100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host Host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an exemplary embodiment, the semiconductor memory device 100 or memory system 1000 may be mounted as a package of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a thin quad flat pack (TQFP), a system in package (SIP), a multi-chip package (MCP), a wafer-level fabricated package (WFP), or a wafer-level processed stack package (WSP).

Figure 6:
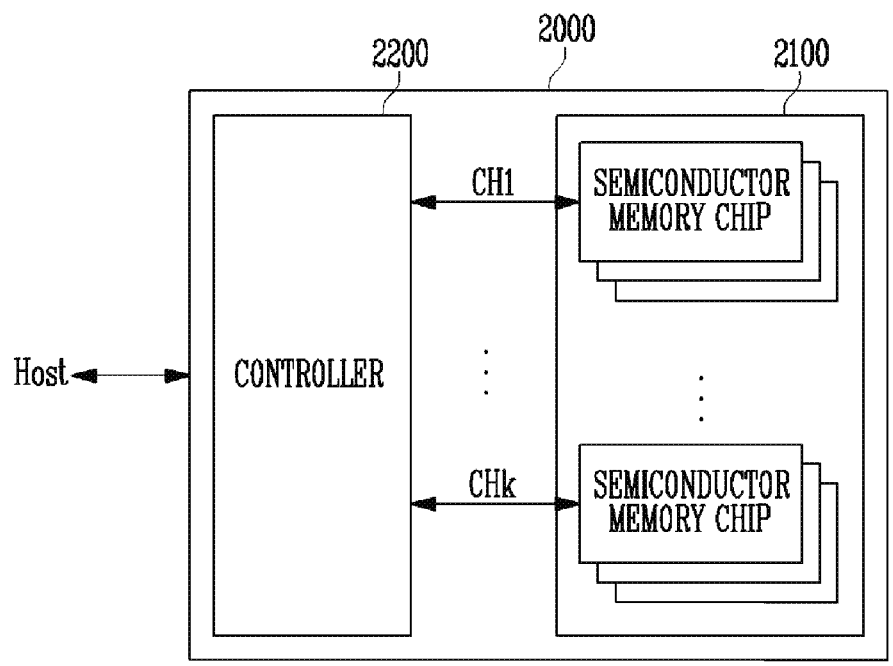
FIG. 6 is a block diagram, illustrating an application example of the memory system of FIG. 5.

FIG. 6 is a block diagram, illustrating an application example of the memory system of FIG. 5.

Referring to FIG. 6, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 6, the plurality of groups communicate with the controller 2200 through first to k-th channels CH1 to CHk, respectively. Each semiconductor memory chip may be configured and operated similarly to the semiconductor memory device 100 described with reference to FIG. 1.

Each group is configured to communicate with the controller 2200 through one common channel. The controller 2200 is configured similarly to the controller 1100 described with reference to FIG. 5 and is configured to control the plurality of memory chips of the semiconductor memory device 2100 through the plurality of channels CH1 to CHk.

Figure 7:
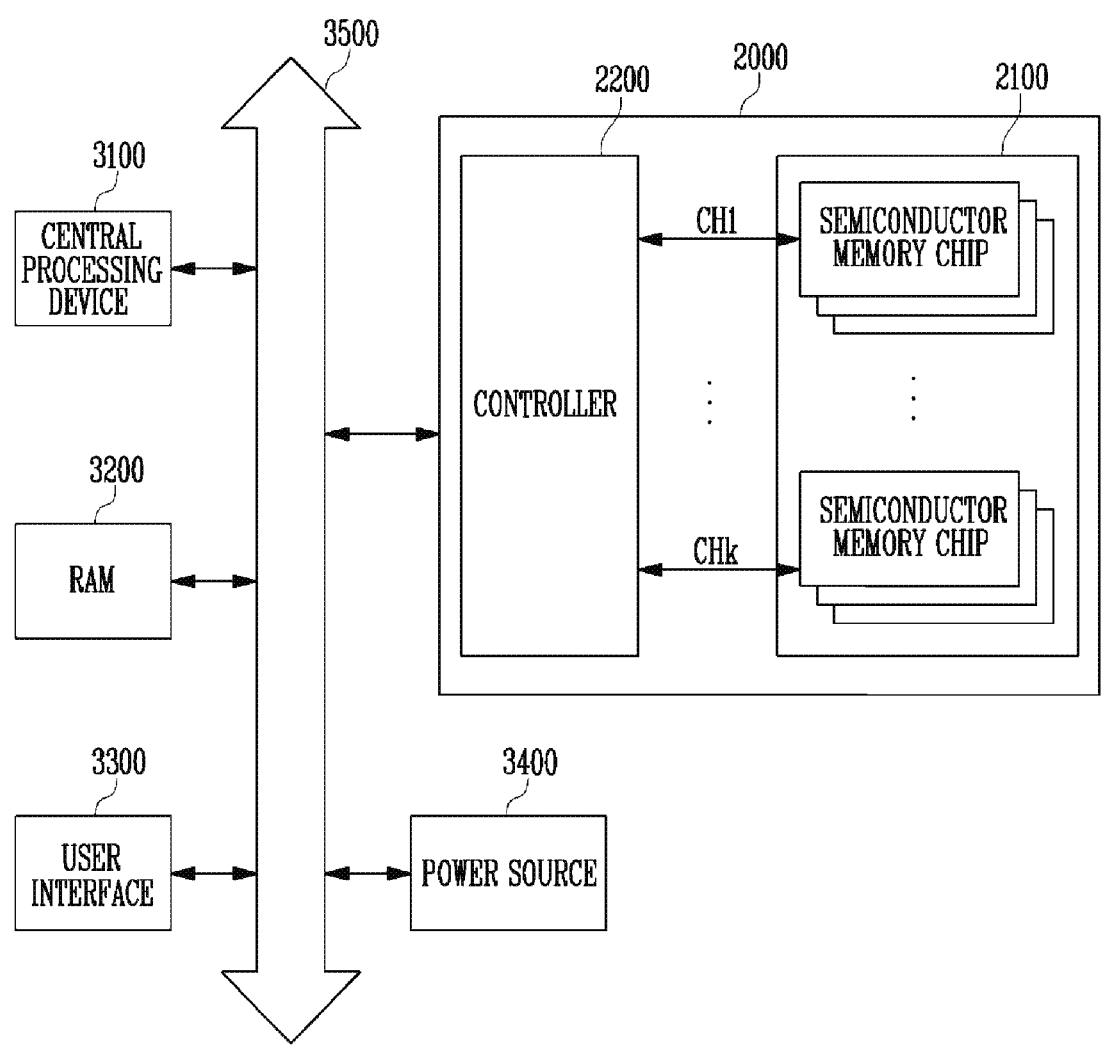
FIG. 7 is a block diagram, illustrating a computing system including the memory system described with reference to FIG. 6.

FIG. 7 is a block diagram, illustrating a computing system including the memory system described with reference to FIG. 6.

Referring to FIG. 7, the computing system 3000 includes a central processing unit 3100, a random access memory (RAM) 3200, a user interface 3300, a power source 3400, a system bus 3500, and the memory system 2000.

The memory system 2000 is electrically connected to the central processing unit 3100, the RAM 3200, the user interface 3300, and the power source 3400 through the system bus 3500. Data provided through the user interface 3300 or processed by the central processing unit 3100 is stored in the memory system 2000.

In FIG. 7, the semiconductor memory device 2100 is connected to the system bus 3500 through the controller 2200. However, the semiconductor memory device 2100 may be configured to be directly connected to the system bus 3500. At this time, a function of the controller 2200 is performed by the central processing unit 3100 and the RAM 3200.

In FIG. 7, the memory system 2000 described with reference to FIG. 6 is provided. However, the memory system 2000 may be replaced with the memory system 1000 described with reference to FIG. 5. As an exemplary embodiment, the computing system 3000 may be configured to include both of the memory systems 1000 and 2000 described with reference to FIGS. 5 and 6.

Although the detailed description of the present disclosure describes specific embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

Although the present disclosure has been described with reference to the limited embodiments and drawings, the present disclosure is not limited to the embodiments described above, and various changes and modifications may be made from the disclosed description by those skilled in the art to which the present disclosure pertains.

Therefore, the scope of the present disclosure should not be limited to the described embodiments, and should be determined by the equivalents of the claims as well as the following claims.

In the embodiments described above, all of the steps may optionally be performed or omitted. In addition, the steps in each embodiment need not occur in order, and may be reversed. Meanwhile, the embodiments of the present disclosure disclosed in the present specification and the drawings are merely specific examples for easily describing the technical content of the present specification and facilitating understanding of the present specification and do not limit the scope of the present specification. That is, it is apparent to those skilled in the art to which the present disclosure pertains that other modification examples based on the technical spirit of the present disclosure are possible.

Meanwhile, the present specification and drawings disclose a preferred embodiment of the present disclosure. Although specific terms are used, they are used in general meaning for purposes of easily describing technical content of the present disclosure and facilitating understanding of the present disclosure, and are not intended to limit the scope of the present disclosure. It is apparent to those skilled in the art to which the present disclosure pertains that other modification examples based on the technical spirit of the present disclosure may be carried out in addition to the embodiments disclosed herein.

What is claimed is:

1. A semiconductor memory device comprising:
a plurality of channel plugs disposed in a cell region of a semiconductor substrate;
a first dummy region disposed at one end portion of the cell region and a second dummy region disposed at an other end portion of the cell region; and
first dummy plugs disposed in the first dummy region and second dummy plugs disposed in the second dummy region,
wherein a number of the first dummy plugs is different than a number of the second dummy plugs.

2. The semiconductor memory device of claim 1, further comprising:
an X decoder region adjacent to the first dummy region, wherein the X decoder region and the cell region are disposed at opposing sides of the first dummy region.

3. The semiconductor memory device of claim 2, further comprising:
an X decoder disposed in the X decoder region of the semiconductor substrate.

4. The semiconductor memory device of claim 3, wherein the X decoder is formed in a layer lower than the first dummy plugs, the plurality of channel plugs, and the second dummy plugs.

5. The semiconductor memory device of claim 4, wherein the plurality of channel plugs are connected, in parallel, to a plurality of word lines, and
the plurality of word lines are connected to the X decoder through a plurality of metal wires, extending, in a vertical direction, to the X decoder region.

6. The semiconductor memory device of claim 5, wherein the plurality of word lines are arranged in a step-wise structure in the X decoder region.

7. The semiconductor memory device of claim 6, wherein the X decoder region further includes an interlayer insulating film stacked on the plurality of word lines of the step-wise structure.

8. The semiconductor memory device of claim 1, wherein the number of the first dummy plugs is greater than the number of the second dummy plugs.

9. The semiconductor memory device of claim 1, wherein the first dummy region is wider than the second dummy region.

10. A semiconductor memory device comprising:
a decoder region, a first dummy region, a cell region, and a second dummy region sequentially arranged, respectively, in a first direction of a semiconductor substrate;
a plurality of channel plugs vertically arranged in the cell region; and
a plurality of first and second dummy plugs arranged in the first dummy region and the second dummy region respectively,
wherein a number of the first dummy plugs is greater than a number of the second dummy plugs.

11. The semiconductor memory device of claim 10, wherein the decoder region is an X decoder region, and
wherein an X decoder is disposed in the X decoder region.

12. The semiconductor memory device of claim 11, wherein the X decoder is formed in a layer lower than the plurality of channel plugs, the first dummy plugs, and the second dummy plugs.

13. The semiconductor memory device of claim 12, wherein the plurality of channel plugs are connected, in parallel, to a plurality of word lines, and
the plurality of word lines are connected to the X decoder through a plurality of metal wires, extending, in a vertical direction, to the X decoder region.

14. The semiconductor memory device of claim 13, wherein the plurality of word lines are arranged in a step-wise structure in the X decoder region.

15. The semiconductor memory device of claim 14, wherein the X decoder region further includes an interlayer insulating film stacked on the plurality of word lines of the step-wise structure.

16. A semiconductor memory device comprising:
a decoder region, a first dummy region, a cell region, and a second dummy region sequentially arranged, respectively, in a first direction of a semiconductor substrate;
a plurality of channel plugs vertically arranged in the cell region; and
a plurality of dummy plugs arranged in the first dummy region and the second dummy region,
wherein the first dummy region is wider than the second dummy region.

17. The semiconductor memory device of claim 16, wherein the number of first dummy plugs disposed in the first dummy region of the plurality of dummy plugs is greater than the number of second dummy plugs disposed in the second dummy region.

18. The semiconductor memory device of claim 17, wherein the decoder region is an X decoder region,
wherein an X decoder is disposed in the X decoder region, and
wherein the X decoder is formed in a layer lower than the plurality of channel plugs, the first dummy plugs, and the second dummy plugs.

19. The semiconductor memory device of claim 18, wherein the plurality of channel plugs are connected, in parallel, to a plurality of word lines, and
the plurality of word lines are connected to the X decoder through a plurality of metal wires, extending, in a vertical direction, to the X decoder region.

20. The semiconductor memory device of claim 19, wherein the X decoder region further includes an interlayer insulating film stacked on the plurality of word lines.

* * * * *